US012776686B2

(12) United States Patent
Yamamoto

(10) Patent No.: US 12,776,686 B2
(45) Date of Patent: Oct. 27, 2026

(54) HEAT MANAGEMENT SYSTEM INCLUDING THERMAL EXPANSION MATERIAL CONFIGURED TO SHRINK OR EXPAND DEPENDING ON TEMPERATURE

(71) Applicant: TOYOTA JIDOSHA KABUSHIKI KAISHA, Toyota (JP)

(72) Inventor: Hiroshi Yamamoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 314 days.

(21) Appl. No.: 18/604,654

(22) Filed: Mar. 14, 2024

(65) Prior Publication Data

US 2025/0079942 A1 Mar. 6, 2025

(30) Foreign Application Priority Data

Aug. 29, 2023 (JP) ................................ 2023-138776

(51) Int. Cl.

| | |
|---|---|
| ***H02K 9/22*** | (2006.01) |
| ***B60L 58/34*** | (2019.01) |
| ***F28F 13/00*** | (2006.01) |
| ***F28F 13/14*** | (2006.01) |
| ***H01M 10/667*** | (2014.01) |
| ***H02K 11/33*** | (2016.01) |
| ***H05K 7/20*** | (2006.01) |

(52) U.S. Cl.

CPC ................ *H02K 9/22* (2013.01); *B60L 58/34* (2019.02); *F28F 13/14* (2013.01); *H01M 10/667* (2015.04); *H02K 11/33* (2016.01); *H05K 7/20509* (2013.01); *H05K 7/20518* (2013.01); *H05K 7/2089* (2013.01); *F28F 2013/005* (2013.01); *F28F 2013/008* (2013.01)

(58) Field of Classification Search

CPC ........... H05K 7/20509; H05K 7/20518; H05K 7/2089; F28F 13/14; F28F 2013/005; F28F 2013/008; H01M 10/667; B60L 58/34; H02K 11/33

See application file for complete search history.

(56) References Cited

U.S. PATENT DOCUMENTS

| | | | | |
|---|---|---|---|---|
| 6,166,937 | A * | 12/2000 | Yamamura ......... | H05K 7/20927 257/E23.098 |
| 8,872,328 | B2 * | 10/2014 | Delgado ............. | H10W 40/255 257/E23.08 |
| 10,292,307 | B1 * | 5/2019 | Wyland ................... | F28F 13/00 |
| 11,889,660 | B2 * | 1/2024 | Schrott ................... | G01F 1/684 |

(Continued)

FOREIGN PATENT DOCUMENTS

| | | |
|---|---|---|
| JP | H05-259667 A | 10/1993 |
| JP | 2008-258199 A | 10/2008 |

(Continued)

*Primary Examiner* — Tulsidas C Patel
*Assistant Examiner* — Daniel K Schlak
(74) *Attorney, Agent, or Firm* — SoraIP, Inc.

(57) ABSTRACT

The heat management system includes a power semiconductor (heat generation portion). The power semiconductor has a heat dissipation path. The heat dissipation path is configured to transfer heat from the power semiconductor to other portions than the power semiconductor. As the temperature of the power semiconductor increases, the amount of heat dissipation of the power semiconductor through the heat dissipation path increases.

2 Claims, 4 Drawing Sheets

(56) References Cited

U.S. PATENT DOCUMENTS

| | | | | |
|---|---|---|---|---|
| 2007/0215316 | A1 | 9/2007 | Saito et al. | |
| 2008/0160246 | A1* | 7/2008 | Buhler | B23H 1/02 361/689 |
| 2009/0294117 | A1* | 12/2009 | Hodes | F28D 15/06 165/104.34 |
| 2010/0128436 | A1* | 5/2010 | Edmunds | F28D 15/0233 165/104.26 |
| 2010/0186938 | A1 | 7/2010 | Murata et al. | |
| 2013/0002173 | A1* | 1/2013 | Baglino | H02P 29/62 318/139 |
| 2013/0126148 | A1* | 5/2013 | Koehler | H10W 40/10 165/287 |
| 2013/0314202 | A1* | 11/2013 | Bolton | F28F 13/00 337/299 |
| 2014/0158334 | A1* | 6/2014 | Dellea | F28D 15/00 165/185 |
| 2015/0090436 | A1* | 4/2015 | Andres | H01M 10/6567 165/276 |
| 2015/0092350 | A1* | 4/2015 | Mayer | F28F 21/00 165/185 |
| 2016/0161155 | A1* | 6/2016 | Guichard | F25B 13/00 62/324.2 |
| 2018/0095481 | A1* | 4/2018 | Swint | F28D 15/00 |
| 2019/0141853 | A1* | 5/2019 | Fertig | H05K 7/20218 |
| 2019/0394899 | A1* | 12/2019 | Zhang | F28F 13/00 |
| 2020/0333057 | A1* | 10/2020 | Alexander | F25B 21/04 |
| 2020/0333091 | A1* | 10/2020 | Busche | F28F 13/00 |
| 2021/0084798 | A1* | 3/2021 | Lee | H05K 7/20854 |
| 2021/0108860 | A1* | 4/2021 | Kulkarni | F28D 15/0233 |
| 2021/0195810 | A1* | 6/2021 | Joshi | H02K 11/33 |
| 2021/0208647 | A1* | 7/2021 | Macias | G06F 1/203 |
| 2022/0163273 | A1* | 5/2022 | Wang | F28F 27/00 |
| 2023/0070604 | A1* | 3/2023 | Chen | H05K 7/20263 |
| 2023/0241970 | A1* | 8/2023 | Wenk | B60K 26/00 180/315 |
| 2023/0263060 | A1* | 8/2023 | Hareyama | H10N 10/13 |
| 2024/0017625 | A1* | 1/2024 | Wenk | H05K 5/0082 |

FOREIGN PATENT DOCUMENTS

| | | | |
|---|---|---|---|
| JP | 2012-218535 | A | 11/2012 |
| WO | 2005/071824 | A1 | 8/2005 |

* cited by examiner

HEAT MANAGEMENT SYSTEM INCLUDING THERMAL EXPANSION MATERIAL CONFIGURED TO SHRINK OR EXPAND DEPENDING ON TEMPERATURE

CROSS-REFERENCE TO RELATED APPLICATION

This application claims priority to Japanese Patent Application No. 2023-138776 filed on Aug. 29, 2023, incorporated herein by reference in its entirety.

BACKGROUND

1. Technical Field

The present disclosure relates to a heat management system and a vehicle.

2. Description of Related Art

WO2005/071824 discloses a technology for cooling a semiconductor device by controlling a temperature of a refrigerant circulating in a flow path provided in a housing of the semiconductor device.

In recent years, a heat management system that performs not only heat dissipation management but also heat generation management has been proposed in the field of automobiles etc. For example, in a system described in WO2005/071824, heat released from the semiconductor device may be used to heat other devices. However, WO2005/071824 describes only the heat management related to the heat dissipation of the semiconductor device (heat dissipation management), and does not describe the heat management using the heat generated by the semiconductor device (heat generation management). Therefore, there are some situations where the heat generation management is not performed appropriately.

SUMMARY

The present disclosure has been made to address the above issue. An object thereof is to appropriately perform both heat dissipation management and heat generation management.

A heat management system according to an aspect of the present disclosure includes a heat generation portion including a plurality of heat dissipation paths.

The heat dissipation paths include a first heat dissipation path and a second heat dissipation path.

The first heat dissipation path is configured to transfer heat from the heat generation portion to another portion other than the heat generation portion.

A heat dissipation amount of the heat generation portion through the second heat dissipation path increases along with a temperature rise of the heat generation portion.

Another aspect of the present disclosure provides a vehicle including the system described above.

According to the present disclosure, it is possible to appropriately perform both the heat dissipation management and the heat generation management.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
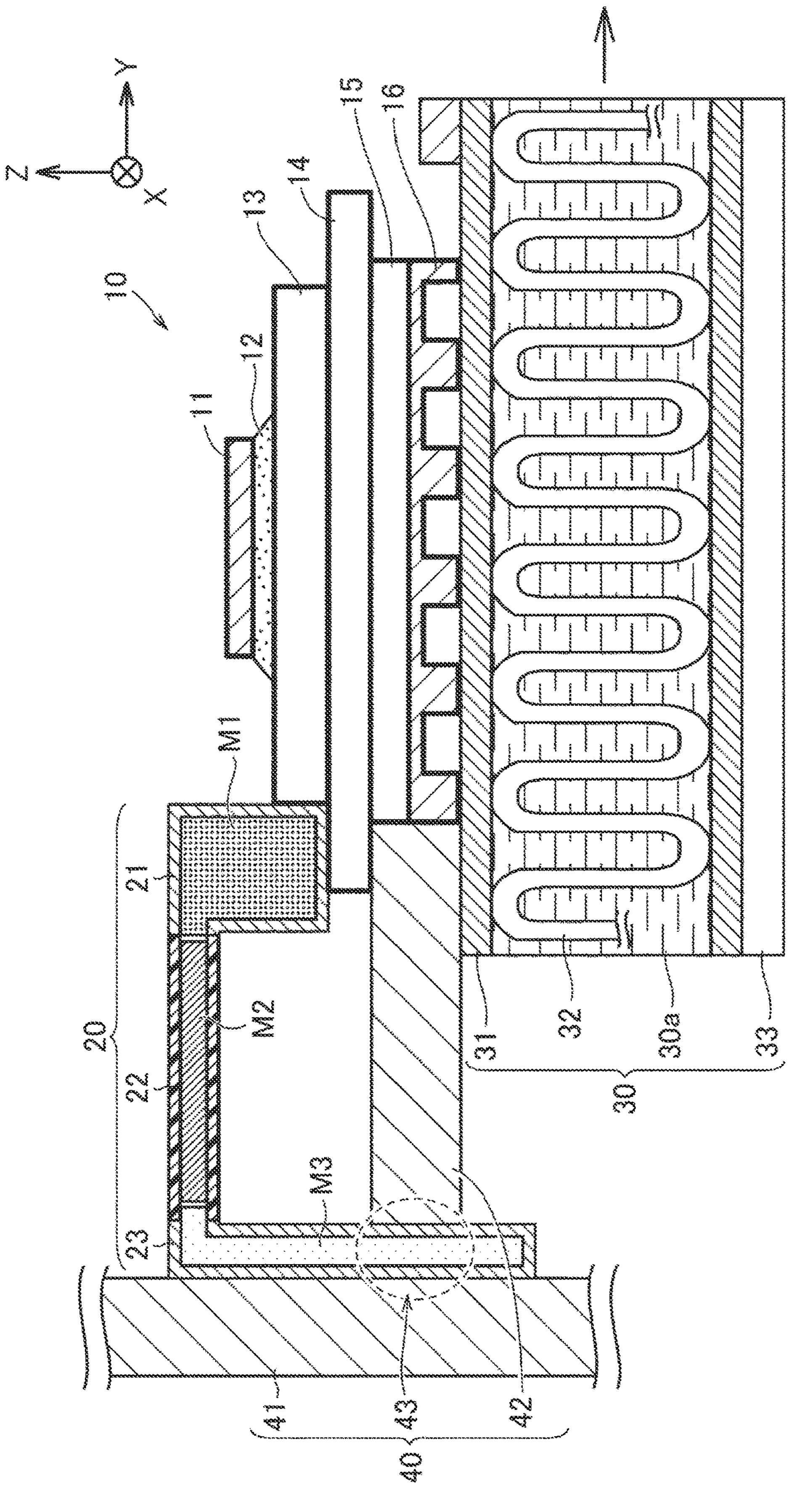
FIG. 1 is a diagram illustrating a heat management system according to an embodiment of the present disclosure.

An embodiment of the present disclosure will be described in detail with reference to the drawings. The same or corresponding parts in the drawings are designated by the same reference signs and repetitive description will be omitted. In the drawings used below, among the X-axis, the Y-axis, and the Z-axis orthogonal to each other, the Z-axis represents the thickness direction of the substrate. Hereinafter, "+" is indicated in the direction indicated by the arrows of the X axis, the Y axis, and the Z axis, and "−" is indicated in the opposite direction. With respect to the two main surfaces (front and back surfaces) of the plate-shaped member (or the laminate thereof), the surface in the +Z direction may be referred to as a "first surface", and the surface in-Z direction may be referred to as a "second surface".

FIG. 1 is a diagram illustrating a heat management system according to an embodiment of the present disclosure. The −Z direction in FIG. 1 corresponds to the direction in which the gravitational force acts (vertically downward). Referring to FIG. 1, the heat management system includes a semiconductor power device 10 including a power semiconductor 11 (heat generation portion), and a heat dissipation path 30 (first heat dissipation path) and a heat dissipation path 40 (second heat dissipation path) of the power semiconductor 11.

The semiconductor power device 10 includes, in addition to the power semiconductor 11, a laminated substrate in which the substrates 13-15 are laminated in the Z direction, and a cooler 16. The substrate 15, the substrate 14, and the substrate 13 are stacked in this order from −Z. Each of the substrates 13 and 15 is, for example, a metal substrate. Each of the substrates 13 and 15 may be a copper plate. The substrate 14 is an insulating substrate made of ceramic. Examples of the ceramic insulating substrate include an alumina substrate, an aluminum nitride substrate, and a silicon nitride substrate. The laminated substrate is, for example, an insulating heat dissipation circuit board having a structure in which a ceramic substrate is sandwiched between two metal substrates. The ceramic substrate and the two metal substrates may be bonded and integrated by an active metal bonding method (AMB) or a direct bonding method (DCB).

The substrate 13 includes an electronic circuit, and the power semiconductor 11 is mounted on the first surface of the substrate 13 via a bonding material 12. Examples of the bonding material 12 include solder and a conductive adhesive. The semiconductor power device 10 is configured to perform power conversion and/or control using the electronic circuit including the power semiconductor 11. A power transistor such as a IGBT, MOSFET or a bipolar power transistor may be exemplified as the power semiconductors 11. Exemplary semiconducting materials include Si, SiC, GaN.

A cooler 16 is bonded to the second surface of the substrate 15. Examples of the bonding material for the cooler 16 include solder and grease. The cooler 16 is configured to transfer the heat received from the laminated substrate to the heat dissipation path 30. The cooler 16 is made of, for example, metal. The cooler 16 has a plurality of protrusions protruding toward the heat dissipation path 30.

The heat dissipation path 30 includes a tube 31 and a heat insulating material 33. The tube 31 is, for example, a cylindrical member made of metal. The heat insulating material 33 is provided on −Z outer surface of the tube 31. Thus, heat-exchange on −Z of the tube 31 is suppressed. However, the present disclosure is not limited thereto, and a heat dissipation material may be provided in place of the heat insulating material 33 to promote heat dissipation −Z the tube 31. The tube 31 houses the heat medium **30*a* and the cooling fin 32 in the tube. The heat medium 30*a* flows through the tube 31 toward +Y, for example. The outer surface of the tube 31 on the +Z side is in contact with each protrusion of the cooler 16. Heat from the cooler 16 is transferred to the heat medium 30*a* and the cooling fin 32 via the tube 31. Exemplary thermal media 30*a*** include water, antifreeze, organofluorine compounds, carbon dioxide, and ammonia.

The cooling fin 32 is, for example, a corrugated metal plate (corrugated fin). The cooling fin 32 is formed so as to move back and forth between the inner surface on the +Z side and the inner surface on −Z side of the tube 31. Such a configuration promotes heat exchanging between the cooling fin 32 and the heat medium **30*a*. The cooling fin 32 is in contact with a portion of the inner surface of the tube 31 on the +Z side facing the protrusion of the cooler 16. This promotes heat exchange between the cooling fin 32 and the cooler 16**.

The heat dissipation path 30 is configured to transfer heat from the power semiconductor 11 to other components (components other than the power semiconductor 11). Hereinafter, the other components that perform heat exchange with the power semiconductor 11 through the heat dissipation path 30 are referred to as "target components". In this embodiment, the heat medium **30*a* flows through the flow path formed by the tube 31. The heat medium 30*a* exchanges heat with each of the power semiconductors 11 and the target components (not shown in FIG. 1). Although details will be described later, an in-vehicle battery is an example of the target component (see FIG. 6**).

The heat management system shown in FIG. 1 further comprises a container 20 capable of exchanging heat with the power semiconductor 11. The container 20 includes a metal portion 21 (first metal portion), a resin portion 22, and a metal portion 23 (second metal portion). The metal portion 21 is in contact with the substrate 13. The metal portion 21 exchanges heat with the power semiconductor 11 via the substrate 13 and the bonding material 12. The metal portion 21, the resin portion 22, and the metal portion 23 are connected to each other to seal an internal space. The resin portion 22 is located between the metal portion 21 and the metal portion 23. The container 20 houses a thermal expansion material M1, a high heat conductivity material M2, and a low heat conductivity material M3 in a sealed interior space. The thermal conductivity of the high heat conductivity material M2 is higher than that of the low heat conductivity material M3. The thermal expansion material M1 has a higher coefficient of thermal expansion than each of the low heat conductivity material M3 and the high heat conductivity material M2.

The thermal expansion material M1 changes its volume in the operating temperature-range of the power semiconductor 11. The thermal expansion material M1 may have a melting point within the operating temperature-region of the power semiconductor 11. The thermal expansion material M1 is, for example, solid-state at room temperature, and liquefies in accordance with the temperature rise of the power semiconductor 11. The volume of the thermal expansion material M1 increases due to liquefaction. Exemplary thermal expansion material M1 include waxes. The high heat conductivity material M2 maintains high fluidity in the operating-temperature range of the power semiconductor 11. The high heat conductivity material M2 may be in a liquid-state or a semi-solid-state in the operating temperature-region of the power semiconductor 11. The thermal conductivity of the high heat conductivity material M2 may be greater than or equal to 50 W/m·K and less than or equal to 100 W/m·K, or may be about 80 W/m·K. Exemplary high heat conductivity material M2 include liquid-sodium, heat-dissipating grease. The low heat conductivity material M3 maintains high-fluidity in the operating-temperature range of the power semiconductor 11. The low heat conductivity material M3 may be a gas in the operating temperature-range of the power semiconductor 11. The thermal conductivity of the low heat conductivity material M3 may be 0.01 W/m·K or more and 1.00 W/m·K or less, and may be about 0.02 W/m·K. Examples of the low heat conductivity material M3 include air-gas, nitrogen-gas and argon-gas. When the thermal expansion material M1, the high heat conductivity material M2, and the low heat conductivity material M3 become different from each other (solid/liquid/gas), the separation is promoted and the mixing is suppressed.

The heat dissipation path 40 includes metal members 41 and 42 and a thermally conductive variable portion 43. The metal member 41 is, for example, a metal case, and functions as a heat dissipation portion that promotes heat dissipation. Although details will be described later, an example of the metal member 41 is a case of an in-vehicle electronic device (see FIG. 6). The semiconductor power device 10 is connected to the metal member 41 via a container 20. The semiconductor power device 10 is in contact with the metal portion 21. The metal member 41 is in contact with the metal portion 23. The resin portion 22 is not in contact with either the semiconductor power device 10 or the metal member 41.

The metal member 42 is, for example, a metal member formed in a rod shape or a plate shape. The metal member 42 is in contact with the substrate 15, the cooler 16, the tube 31, and the metal portion 23 of the container 20. The metal member 42 transfers heat from the power semiconductor 11 to the thermally conductive variable portion 43. The metal member 42 is connected to the metal member 41 via the thermally conductive variable portion 43. The metal member 42 and the thermally conductive variable portion 43 function as a heat conductive portion that transfers heat from the power semiconductor 11 to the metal member 41 (heat dissipation portion). The thermally conductive variable portion 43 is configured to have high thermal conductivity in accordance with the temperature rise of the power semiconductor 11.

The thermally conductive variable portion 43 includes a metal portion 23 of the container 20. In the container 20, the metal portion 21 is configured to transfer the heat generated by the power semiconductor 11 to the thermal expansion material M1. The thermal expansion material M1 contracts and expands in accordance with the temperature of the power semiconductor 11. The high heat conductivity material M2 and the low heat conductivity material M3 move within the container 20 in response to shrinkage/expansion of the thermal expansion material M1.

Figure 2:
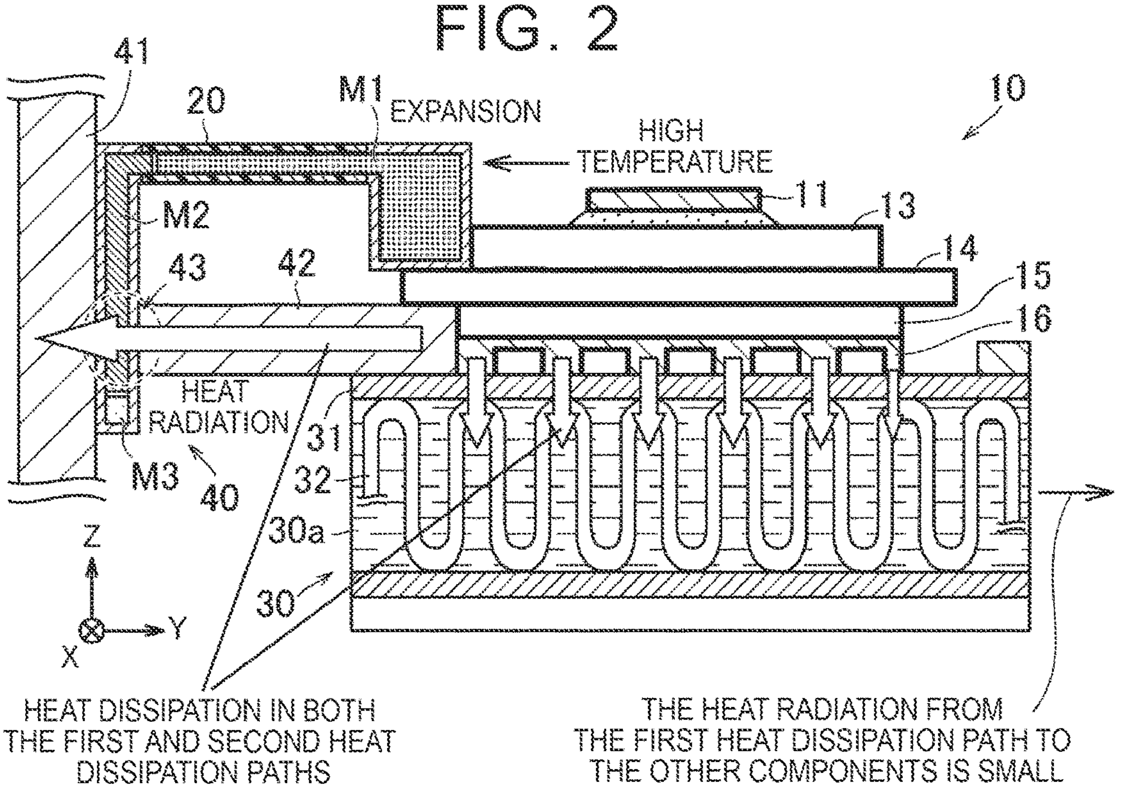
FIG. 2 is a diagram illustrating a state of the heat management system when the heat generation portion is at a high temperature.

FIG. 2 is a diagram illustrating a state of the heat management system when the power semiconductor 11 is in a high load state. As the load of the power semiconductor 11 increases, the temperature of the power semiconductor 11 increases. As shown in FIG. 2, the thermal expansion material M1 expands in accordance with the temperature rise of the power semiconductor 11. Then, by the force generated by the expansion of the thermal expansion material M1, the high heat conductivity material M2 moves in the container 20 so as to be included in the thermally conductive variable portion 43. The low heat conductivity material M3 is compressed and moved through the container 20 so as not to be included in the thermally conductive variable portion 43. The low heat conductivity material M3 is pushed into the end of the container 20. This increases the thermal conductivity of the thermally conductive variable portion 43. The amount of heat dissipation of the power semiconductor 11 through the heat dissipation path 40 increases. Heat from the power-semiconductor 11 is transferred to the metal member 41 via the metal member 42 and the thermally conductive variable portion 43 (high heat conductivity material M2). The cooling of the power semiconductor 11 is promoted by the heat dissipation of the power semiconductor 11 in both the heat dissipation paths 30 and 40. As described above, the thermally conductive variable portion 43 has a high thermal conductivity in accordance with the temperature rise of the power semiconductor 11. Therefore, the amount of heat transferred from the power semiconductor 11 to the metal member 41 (the heat dissipation portion) increases in accordance with the temperature rise of the power semiconductor 11. This promotes cooling of the power semiconductor 11 when the temperature of the power semiconductor 11 is high.

Figure 3:
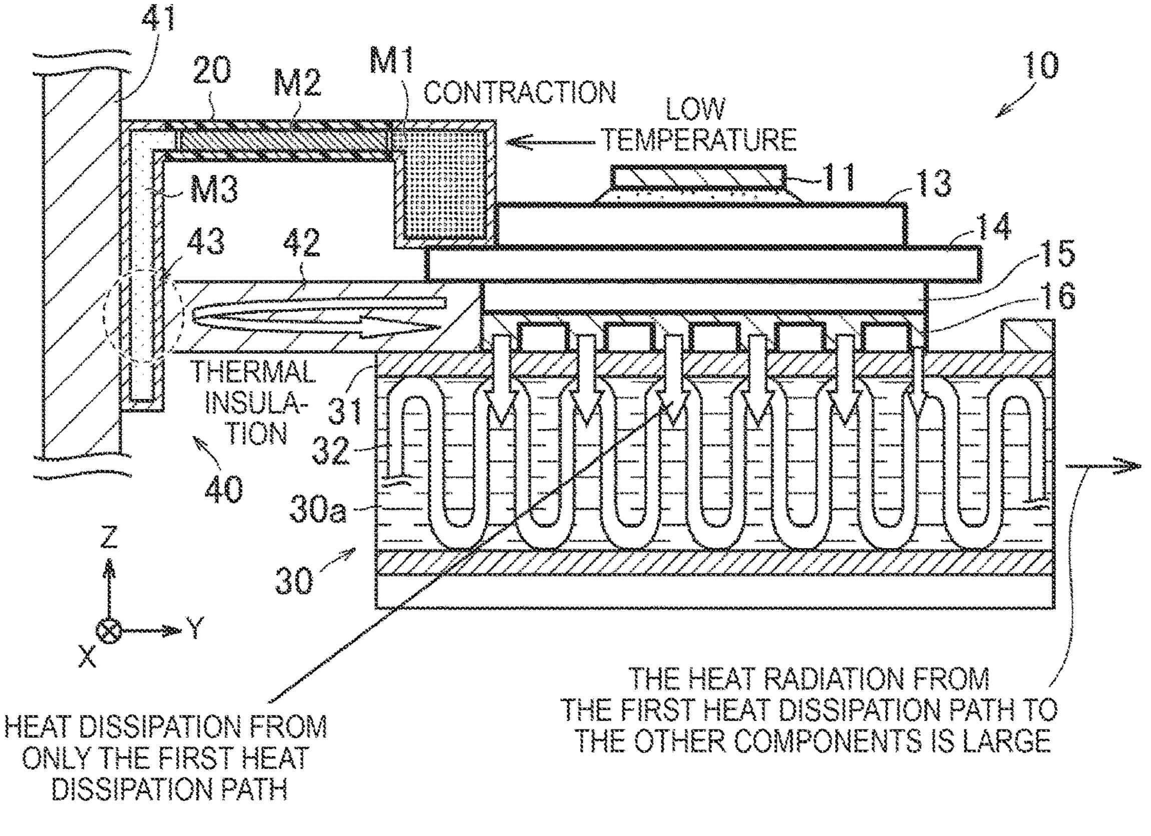
FIG. 3 is a diagram illustrating a state of the heat management system when the heat generation portion is at a low temperature.

FIG. 3 is a diagram illustrating a state of the heat management system when the power semiconductor 11 is in a low-load state. When the load of the power semiconductor 11 is low, the temperature of the power semiconductor 11 is also low. As shown in FIG. 3, the thermal expansion material M1 shrinks in accordance with the temperature drop of the power semiconductor 11. Then, the low heat conductivity material M3 expands by the force generated by the shrinkage of the thermal expansion material M1, and moves in the container 20 so as to be included in the thermally conductive variable portion 43. The high heat conductivity material M2 moves in the container 20 so as not to be included in the thermally conductive variable portion 43. As a result, the thermal conductivity of the thermally conductive variable portion 43 is lowered. Heat is hardly transferred from the power semiconductor 11 to the metal member 41. Therefore, the amount of heat dissipation of the power semiconductor 11 through the heat dissipation path 40 is reduced. The thermally conductive variable portion 43 (low heat conductivity material M3) may be thermally insulated. The low heat conductivity material M3 may prohibit heat dissipation of the power semiconductor 11 through the heat dissipation path 40. As the amount of heat dissipation of the power semiconductor 11 through the heat dissipation path 40 decreases, the amount of heat transferred from the power semiconductor 11 to the heat dissipation path 30 increases. Therefore, the temperature of the target component can be easily increased by using the heat generated by the power semiconductor 11.

As described above, the power semiconductor 11 (heat generation portion) has a plurality of heat dissipation paths (heat dissipation paths 30 and 40). By transferring the heat from the power semiconductor 11 to another portion (a portion other than the power semiconductor 11) through the heat dissipation path 30, the temperature of the other portion can be increased by using the heat generated by the power semiconductor 11. Further, by simultaneously radiating the power semiconductor 11 through the plurality of heat dissipation paths, the total heat dissipation amount of the power semiconductor 11 is increased, and the power semiconductor 11 is easily cooled. However, when the power semiconductor 11 is radiated by a plurality of heat dissipation paths, the amount of heat radiation per path decreases. Therefore, in the case where the power semiconductor 11 is radiated by the heat dissipation paths 30 and 40, the amount of heat transferred to other portions through the heat dissipation path 30 is smaller than in the case where the power semiconductor 11 is radiated only by the heat dissipation path 30. This makes it difficult for the temperature of the other parts to rise.

Therefore, in the heat management system according to this embodiment, the amount of heat dissipation of the power semiconductor 11 through the heat dissipation path 40 is increased in accordance with the temperature rise of the power semiconductor 11. That is, the amount of heat dissipation of the power semiconductor 11 through the heat dissipation path 40 is smaller when the temperature of the power semiconductor 11 is lower than when the temperature of the power semiconductor 11 is higher (see FIGS. 2 and 3). When the heat emitted from the power semiconductor 11 is less likely to be transmitted to the heat dissipation path 40, the amount of heat transmitted from the power semiconductor 11 to the heat dissipation path 30 increases. When the amount of heat dissipation of the power semiconductor 11 through the heat dissipation path 40 decreases, the amount of heat dissipation of the power semiconductor 11 through the heat dissipation path 30 increases. Since the power semiconductor 11 and the other portions (including the target component) are thermally connected through the heat dissipation path 30, it is highly likely that the temperature of the other portions is also low when the temperature of the power semiconductor 11 is low. Therefore, it is highly likely that the temperature rise (heat generation) of the other portion is required when the temperature of the power semiconductor 11 is low. In the above-described system, when the temperature of the power semiconductor 11 is low, the amount of heat transferred from the power semiconductor 11 to the other portion through the heat dissipation path 30 can be increased, and the temperature rise of the other portion can be promoted. On the other hand, when the temperature of the power semiconductor 11 is high, there is a high possibility that cooling of the power semiconductor 11 is required. In the above-described system, the amount of heat dissipation of the power semiconductor 11 through the heat dissipation path 40 increases in accordance with the increase in temperature of the power semiconductor 11. As a result, when the temperature of the power semiconductor 11 is high, the total heat dissipation amount of the power semiconductor 11 increases, and cooling of the power semiconductor 11 is promoted. As described above, according to the above system, it is possible to appropriately perform both the heat dissipation management and the heat creation management.

In the heat management system according to this embodiment, the thermal expansion material M1 displaces the high heat conductivity material M2 and the low heat conductivity material M3 in accordance with the temperature of the power semiconductor 11. The thermal expansion material M1 pulls or pushes the thermally conductive materials by shrinking or expanding. When the thermally conductive variable portion 43 includes the high heat conductivity material M2, the thermal conductivity of the thermally conductive variable portion 43 becomes high (see FIG. 2), and when the thermally conductive variable portion 43 includes the low heat conductivity material M3, the thermal conductivity of the thermally conductive variable portion 43 becomes low (see FIG. 3). In such a configuration, no electronic control and power supply is required to move the high heat conductivity material M2 and the low heat conductivity material M3 because the high heat conductivity material M2 and the low heat conductivity material M3 move due to physical phenomena.

The container 20 illustrated in FIG. 1 includes a metal portion 21 (first metal portion), a resin portion 22, and a metal portion 23 (second metal portion). In general, metals have high thermal conductivity and resins have high thermal insulation. Since the container 20 has the metal portion 21, the heat generated by the power semiconductor 11 is easily transferred to the thermal expansion material M1. As a result, the thermal expansion material M1 is easily deformed (contracted and expanded) in accordance with the temperature of the power semiconductor 11. In addition, since the container 20 has the metal portion 23, it is possible to prevent the container 20 (the thermal expansion material and the cylindrical body containing the respective thermal conduction materials) from interfering with the thermal conduction of the power semiconductor 11. Further, since the container 20 includes the resin portion 22, heat exchanging between the thermal expansion material M1 and the outside air is suppressed. When the heat exchange between the thermal expansion material M1 and the outside air is more prevalent than the heat exchange between the thermal expansion material M1 and the power semiconductor 11, the thermal expansion material M1 may not be in accordance with the temperature of the power semiconductor 11. The thermal expansion material M1 and the outside air are suppressed from being heat-exchanged by the resin portion 22, so that the thermal expansion material M1 is likely to be in a condition corresponding to the temperature of the power semiconductor 11.

Figure 4:
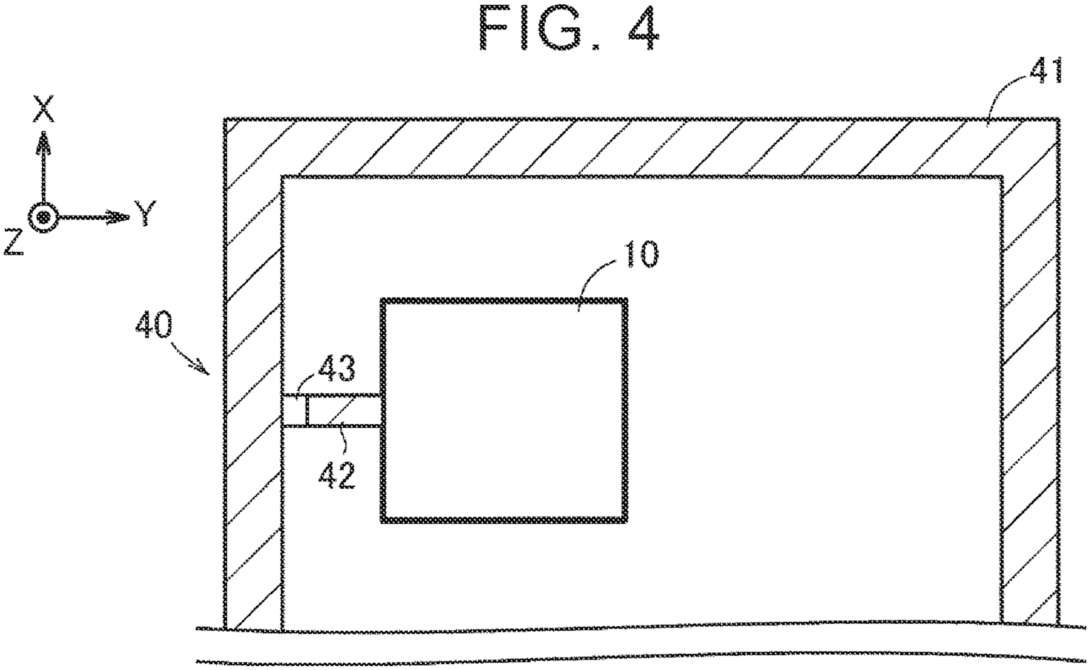
FIG. 4 is a diagram illustrating an example of a planar structure of a second heat dissipation path.

FIG. 4 is a diagram illustrating an example of a planar structure of the heat dissipation path 40 (second heat dissipation path). As illustrated in FIG. 4, the heat dissipation path 40 may include one metal member 42 formed in a rod shape. The semiconductor power device 10, the metal member 42, the thermally conductive variable portion 43, and the metal member 41 may be connected in this order. However, the shape and the number of the metal members 42 and the thermally conductive variable portions 43 can be changed as appropriate.

Figure 5:
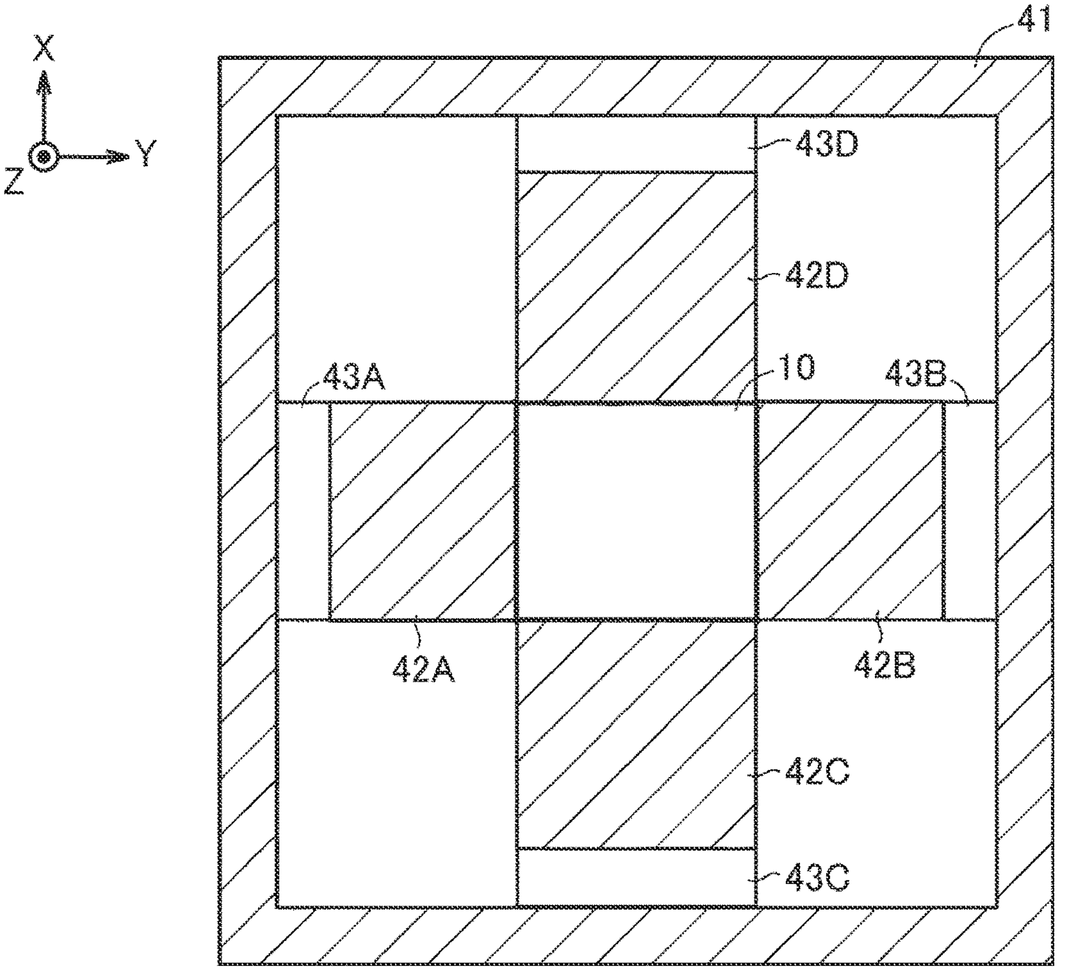
FIG. 5 is a diagram illustrating a modification of the planar configuration of the second heat dissipation path.

FIG. 5 is a diagram illustrating a modification of the planar structure of the second heat dissipation path. As shown in FIG. 5, the second heat dissipation path may have four metal members 42A-42D formed in a plate shape. In this variant, one end of each of the metal members 42A-42D is connected to the semiconductor power device 10. The other ends of the metal members 42A, 42B, 42C, 42D are connected to the metal member 41 via the thermally conductive variable portions 43A, 43B, 43C, 43D. Each of the thermally conductive variable portions 43A-43D has the same configuration as the thermally conductive variable portion 43 illustrated in FIG. 1, for example. Note that the configuration shown in FIG. 5 may be a configuration in which the metal members 42C, 42D and the thermally conductive variable portion 43C, 43D are removed. Alternatively, the configuration shown in FIG. 5 may be a configuration in which the metal members 42B, 42D and the thermally conductive variable portion 43B, 43D are removed.

Figure 6:
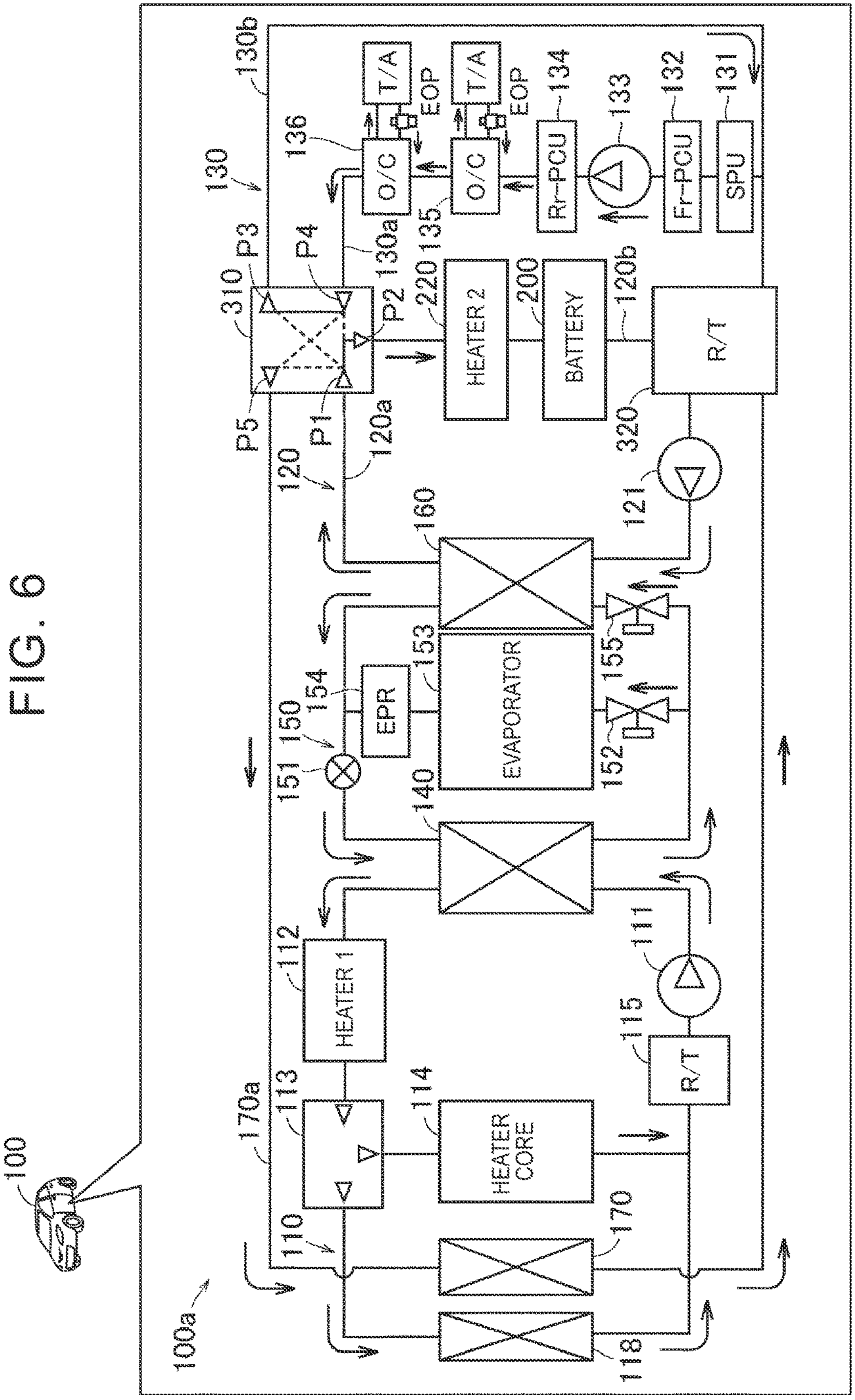
FIG. 6 is a diagram illustrating a vehicle to which the heat dissipation structure illustrated in FIG. 1 is applied.

FIG. 6 is a diagram illustrating a heat management system 100*a* to which the heat dissipation structure illustrated in FIG. 1 is applied. Referring to FIG. 6, the heat management system 100*a* is mounted on, for example, a vehicle 100. The vehicle 100 is electrified vehicle (xEV) configured to be able to travel by electric power discharged from a battery 200 (power storage device), which will be described later. The vehicle 100 may be, for example, BEV (battery electric vehicle) or PHEV (plug-in hybrid electric vehicle).

The heat management system 100*a* includes a first circuit 110, a second circuit 120, a third circuit 130, a condenser 140, a refrigeration cycle 150, a chiller 160, a five-way valve 310, and a reservoir tank (R/T) 320. The five-way valve 310 and the reservoir tank 320 are shared by the second circuit 120 and the third circuit 130. The condenser 140, the refrigeration cycle 150, and the chiller 160 are disposed between the first circuit 110 and the second circuit 120, and function as a heat transfer mechanism.

The first circuit 110 includes a pump 111, an electric heater 112, a three-way valve 113, a heater core 114, and a reservoir tank (R/T) 115 and radiator 118. The pump 111 circulates the heat medium to the first circuit 110.

The five-way valve 310 comprises five-port P1-P5. P1 and P2 of the five-way valve 310 are connected to form a second circuit 120 including the flow path 120*a* and 120*b*. The flow path 120*a* includes a pump 121 and a chiller 160. The flow path 120*b* includes a battery 200 and electric heaters 220. The pump 121 circulates the heat medium to the second circuit 120. Each of the port P3, P4 of the five-way valve 310 is connected to the reservoir tank 320 via a flow path 130*b*, 130*a*. The connecting of the port P3 and P4 forms the third circuit 130 including the flow path 130*a* and 130*b*. The flow path 130*a* includes a Smart Power Unit (SPU) 131, a Power Control Unit (PCU) 132, 134, a pump 133, and an oil cooler (O/C) 135, 136. The pump 133 circulates the heat medium to the third circuit 130. Each of the oil coolers 135,136 cools the oil supplied to T/A of the vehicle 100 by an electric oil pump (EOP). The ported P5 of the five-way valve 310 is connected to the reservoir tank 320 via a flow path 170*a*. The flow path 170*a* includes a radiator 170.

SPU 131 functions as an in-vehicle charger/discharger (charger and discharger) of the battery 200. However, it is not essential that the vehicle 100 have an external power supply function (for example, a V2H function). SPU 131 includes, for example, power converting circuitry. PCU 132, 134 drives a Fr-MG (front motor) and a Rr-MG (rear motor) (not shown) using electric power supplied from the battery 200. MG correspond to motors that drive the vehicle 100. The torque outputted by the respective MG rotates the drive wheels of the vehicle 100 via T/A. T/A functions as a power transmission. The battery 200 functions as a traveling power storage device. PCU may include bi-directional inverters.

The refrigeration cycle 150 includes a compressor 151, an electric expansion valve 152, an evaporator 153, a Evaporative Pressure Regulator (EPR) 154, and an electric expansion valve 155. The condenser 140 is connected to both the first circuit 110 and the refrigeration cycle 150, and functions as a heat exchanger. The chiller 160 is connected to both the refrigeration cycle 150 and the flow path 120*a*, and functions as a heat-exchanger. The air conditioner mounted on the vehicle 100 performs air conditioning (heating and cooling) inside the vehicle 100 using the first circuit 110 and the refrigeration cycle 150. For example, the heater core 114 warms the air in the vehicle cabin, and the evaporator 153 cools the air in the vehicle cabin.

The refrigeration cycle 150, the chiller 160, SPU 132, PCU, the heaters, the pumps, and the valves in the heat management system 100*a* are controlled by an in-vehicle Electronic Control Unit (ECU) (not shown). Each of PCU 132, 134 comprises the semiconductor power device 10 shown in FIG. 1. The case of the respective PCU corresponds to the metal member 41. In the heat management system 100*a*, the battery 200 corresponds to a target component, and the flow path 130*a* includes the heat dissipation path 30 illustrated in FIG. 1. By applying the heat dissipation scheme shown in FIG. 1 to the vehicle 100, the power limit of the vehicle 100 caused by the high-load-temperature rise of the respective PCU is suppressed. Further, when the temperature of each PCU is low, the heat generation by each PCU can be promoted (heat transfer to the flow path 130*a*) with the ports P3 and P4 of the five-way valve 310 connected. This allows the battery 200 to be heated by using the heat generated by the power semiconductor 11 in the respective PCU. As described above, according to the vehicle 100, it is possible to increase the temperature of the battery 200 by using the heat generated by the semiconductor power device 10 in the low-temperature environment while suppressing the overheating of the semiconductor power device 10 in the high-temperature environment.

The heat dissipation structure shown in FIG. 1 can be changed as appropriate. The actuator for moving the heat conductive material (high heat conductivity material M2/low heat conductivity material M3) is not limited to the actuator using the thermal expansion material M1 shown in FIG. 1. For example, the heat conductive material may be moved in accordance with the temperature rise of the heat generation portion by a bimetal or a pump that can rotate forward and backward. The heat generation portion is not limited to the power semiconductor, and may be a component that generates heat other than the power semiconductor. The heat dissipation structure illustrated in FIG. 1 may be applied to a moving body other than an automobile. Examples of mobile bodies other than automobiles include vehicles other than automobiles (ships, airplanes, etc.), mobile machines (agricultural machinery, building machinery, etc.), and unmanned mobile bodies (unmanned guided vehicles, robots, etc.). In addition, the heat dissipation structure shown in FIG. 1 may be applied to the stationary system.

The embodiments disclosed herein are illustrative and not restrictive in all respects. The scope of the present disclosure is defined by the terms of the claims, rather than the description of the embodiments described above, and includes all modifications within the scope equivalent to the terms of the claims.

What is claimed is:

1. A heat management system comprising:

a heat generation portion including a plurality of heat dissipation paths; and a container configured to exchange heat with the heat generation portion, wherein the heat dissipation paths include a first heat dissipation path and a second heat dissipation path, the first heat dissipation path is configured to transfer heat from the heat generation portion to another portion other than the heat generation portion, a heat dissipation amount of the heat generation portion through the second heat dissipation path increases along with a temperature rise of the heat generation portion, the first heat dissipation path includes a flow path through which a heat medium for exchanging heat with the heat generation portion and the other portion flows, the second heat dissipation path includes a heat dissipation portion and a heat conductive portion configured to transfer the heat from the heat generation portion to the heat dissipation portion, at least part of the heat conductive portion is configured to increase a heat conductivity along with the temperature rise of the heat generation portion, the container contains a low heat conductivity material, a high heat conductivity material having a higher heat conductivity than the low heat conductivity material, and a thermal expansion material having a higher thermal expansion coefficient than the low heat conductivity material and the high heat conductivity material, the thermal expansion material is configured to shrink or expand depending on a temperature of the heat generation portion, the low heat conductivity material is configured to move in the container to be included in the heat conductive portion by a force generated by shrinkage or expansion of the thermal expansion material, and the high heat conductivity material is configured to move in the container to be included in the heat conductive portion by a force generated by expansion or shrinkage of the thermal expansion material.

2. The heat management system according to claim 1, wherein:

the container includes a first metal portion, a resin portion, and a second metal portion;

the first metal portion is configured to transfer the heat generated by the heat generation portion to the thermal expansion material;

the second metal portion is included in the heat conductive portion; and the resin portion is positioned between the first metal portion and the second metal portion.

* * * * *